(12) United States Patent
Oh et al.

(10) Patent No.: US 12,455,510 B2
(45) Date of Patent: Oct. 28, 2025

(54) SUBSTRATE PROCESSING APPARATUS AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Kyoungwhan Oh, Suwon-si (KR); Ho Young Kim, Seoul (KR); Sunghwan Kim, Suwon-si (KR); Jaekyung Park, Seoul (KR); Jaehong Lee, Suwon-si (KR); Yohan Choe, Suwon-si (KR)

(73) Assignees: Samsung Electronics Co., Ltd. (KR); Seoul National University R&DB Foundation (KR)

( * ) Notice: Subject to any disclaimer, the term of this patent is extended or adjusted under 35 U.S.C. 154(b) by 126 days.

(21) Appl. No.: 18/436,127

(22) Filed: Feb. 8, 2024

(65) Prior Publication Data
US 2024/0310739 A1    Sep. 19, 2024

(30) Foreign Application Priority Data
Mar. 16, 2023  (KR) ........................ 10-2023-0034590

(51) Int. Cl.
*G03F 7/00* (2006.01)
*G03F 7/20* (2006.01)

(52) U.S. Cl.
CPC ........ *G03F 7/70725* (2013.01); *G03F 7/2043* (2013.01); *G03F 7/70808* (2013.01)

(58) Field of Classification Search
CPC .................................................. G03F 7/70725
See application file for complete search history.

(56) References Cited

U.S. PATENT DOCUMENTS

| | | | |
|---|---|---|---|
| 3,961,401 A | 6/1976 | Ferrier et al. | |
| 5,270,787 A | 12/1993 | Shofner et al. | |
| 5,449,117 A | 9/1995 | Muderlak et al. | |
| 5,741,114 A | 4/1998 | Onodera | |
| 5,908,282 A | 6/1999 | Onodera | |

(Continued)

FOREIGN PATENT DOCUMENTS

| | | |
|---|---|---|
| JP | 6016330 B2 | 10/2016 |
| KR | 10-0578272 B1 | 5/2006 |

(Continued)

*Primary Examiner* — Jason Y Ko
(74) *Attorney, Agent, or Firm* — Fish & Richardson P.C.

(57) ABSTRACT

A substrate processing apparatus includes a substrate stage configured to support a semiconductor substrate, the substrate stage being rotatable at a predetermined angular velocity, and a discharge device above the substrate stage, the discharge device being configured to discharge a chemical solution onto the semiconductor substrate, and the discharge device including a nozzle arm movable along a radial direction from a central region of the substrate stage to a peripheral region surrounding the central region, a nozzle on the nozzle arm, the nozzle facing the substrate stage, and the nozzle being configured to discharge the chemical solution onto the semiconductor substrate at a predetermined angle relative to a surface of the semiconductor substrate, and an angle changer configured to change the predetermined angle such that the predetermined angle gradually decreases as the nozzle arm moves from the central region to the peripheral region.

20 Claims, 14 Drawing Sheets

(56) References Cited

U.S. PATENT DOCUMENTS

| | | |
|---|---|---|
| 8,241,914 B2 | 8/2012 | Durack et al. |
| 8,410,437 B2 | 4/2013 | Brown et al. |
| 8,535,938 B2 | 9/2013 | Durack et al. |
| 8,613,125 B2 | 12/2013 | Jeong et al. |
| 8,758,663 B2 | 6/2014 | Elsey |
| 10,359,702 B2 | 7/2019 | Shimoaoki et al. |
| 11,079,679 B2 | 8/2021 | Hashimoto et al. |

FOREIGN PATENT DOCUMENTS

| | | |
|---|---|---|
| KR | 10-1252967 B1 | 4/2013 |
| KR | 10-2115041 B1 | 5/2020 |

SUBSTRATE PROCESSING APPARATUS AND METHOD OF MANUFACTURING SEMICONDUCTOR DEVICE USING THE SAME

CROSS-REFERENCE TO RELATED APPLICATION

This application claims priority under 35 U.S.C. § 119 to Korean Patent Application No. 10-2023-0034590, filed on Mar. 16, 2023, in the Korean Intellectual Property Office (KIPO), the contents of which are herein incorporated by reference in their entirety.

BACKGROUND

1. Field

Example embodiments relate to a substrate processing apparatus and a method of manufacturing a semiconductor device using the same. More particularly, example embodiments relate to a substrate processing apparatus for performing a development process on a semiconductor substrate and a method of manufacturing the semiconductor device using the same.

2. Description of the Related Art

When performing a development process on a semiconductor substrate, a substrate stage supporting the semiconductor substrate may be rotated. A chemical solution for forming a photoresist pattern may be applied on the semiconductor substrate held by the substrate stage that is rotated at a predetermined velocity. The chemical solution may be discharged through a nozzle that is movable over the semiconductor substrate.

SUMMARY

According to example embodiments, a substrate processing apparatus includes a substrate stage configured to support a semiconductor substrate and rotatable at a predetermined angular velocity, and a discharge device configured to discharge a chemical solution onto the semiconductor substrate. The discharge device includes a nozzle arm movable along a radial direction from a central region of the semiconductor substrate disposed on the substrate stage to a peripheral region surrounding the central region, a nozzle provided on the nozzle arm toward the semiconductor substrate, the nozzle configured to discharge the chemical solution onto the semiconductor substrate at a predetermined angle from a surface of the semiconductor substrate, and an angle changer configured to change the predetermined angle such that the predetermined angle gradually decreases as the nozzle arm moves from the central region to the peripheral region.

According to example embodiments, in a method of manufacturing a semiconductor device, a photosensitizer is applied on a semiconductor substrate to form a photoresist layer. An exposure process to irradiate light is performed onto the photoresist layer. The development process is performed to form a photoresist pattern by removing at least a portion of the photoresist layer through a chemical solution. In performing the development process, a substrate stage on which the semiconductor substrate is supported is rotated at a predetermined angular velocity. A nozzle over the semiconductor substrate is moved from a center of the semiconductor substrate in a radial direction, wherein the nozzle is configured to discharge the chemical solution onto. A predetermined angle of the nozzle from a surface of the semiconductor substrate is gradually decreased while moving the nozzle. The predetermined angular velocity and the predetermined angle are changed according to a position of the nozzle.

According to example embodiments, a substrate processing apparatus includes a substrate stage disposed in a chamber for performing a development process on a semiconductor substrate, the substrate stage configured to support the semiconductor substrate and rotatable at a predetermined angular velocity, a discharge device including a nozzle arm, a nozzle and an angle changer, the nozzle arm movable along a radial direction from a central region of the semiconductor substrate disposed on the substrate stage to a peripheral region surrounding the central region, the nozzle provided on the nozzle arm and configured to discharge a chemical solution onto the semiconductor substrate in a linear velocity direction in which the semiconductor substrate rotates, at a predetermined angle from a surface of the semiconductor substrate, and the angle changer configured to change the predetermined angle such that the predetermined angle gradually decreases as the nozzle arm moves from the central region to the peripheral region, and a control device configured to control the predetermined angular velocity and the predetermined angle according to a position of the nozzle.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be explained in detail with reference to the accompanying drawings.

Figure 1A:
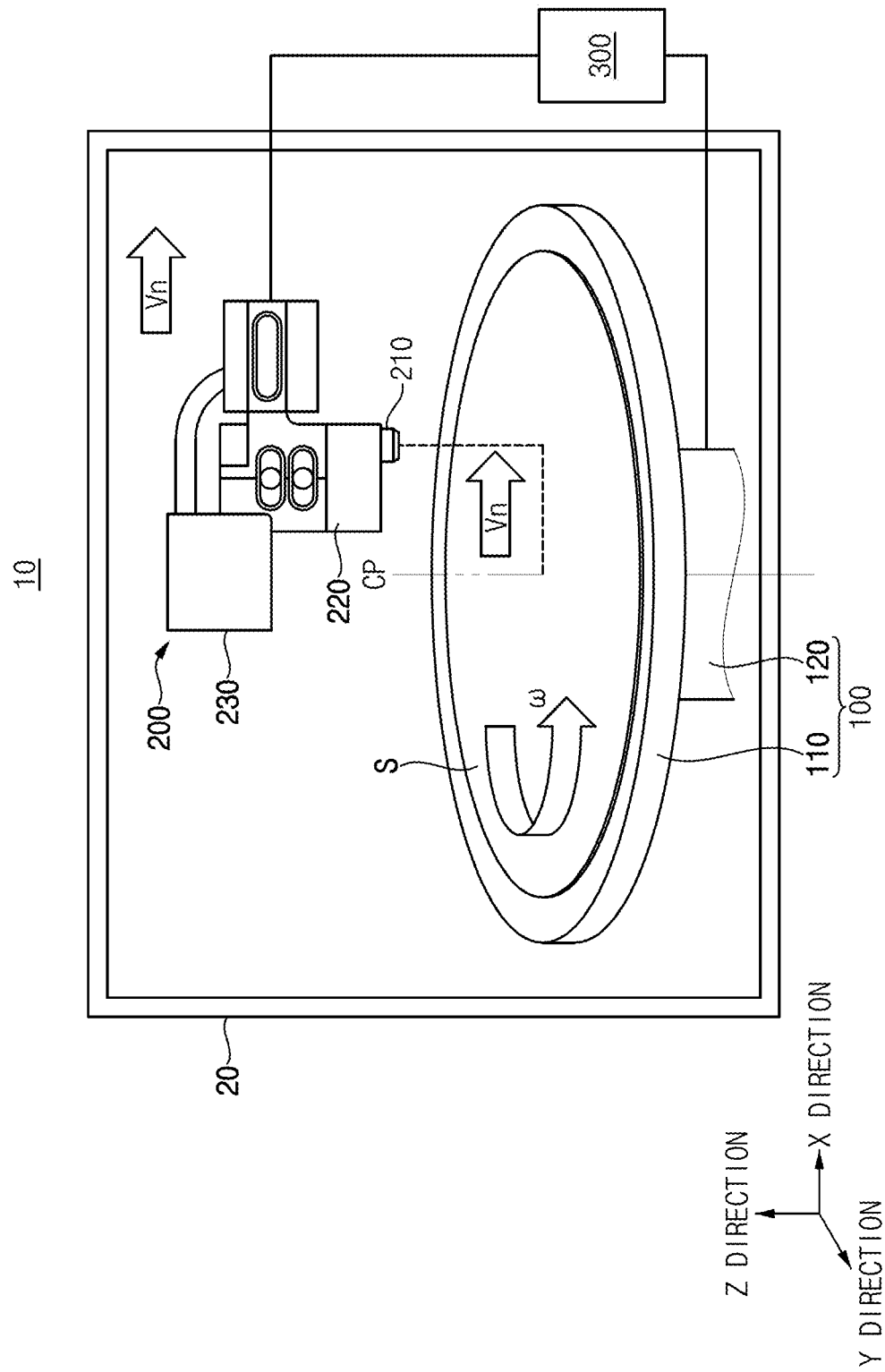
FIGS. 1A and 1B are views illustrating a substrate processing apparatus in accordance with example embodiments.
Figure 1B:
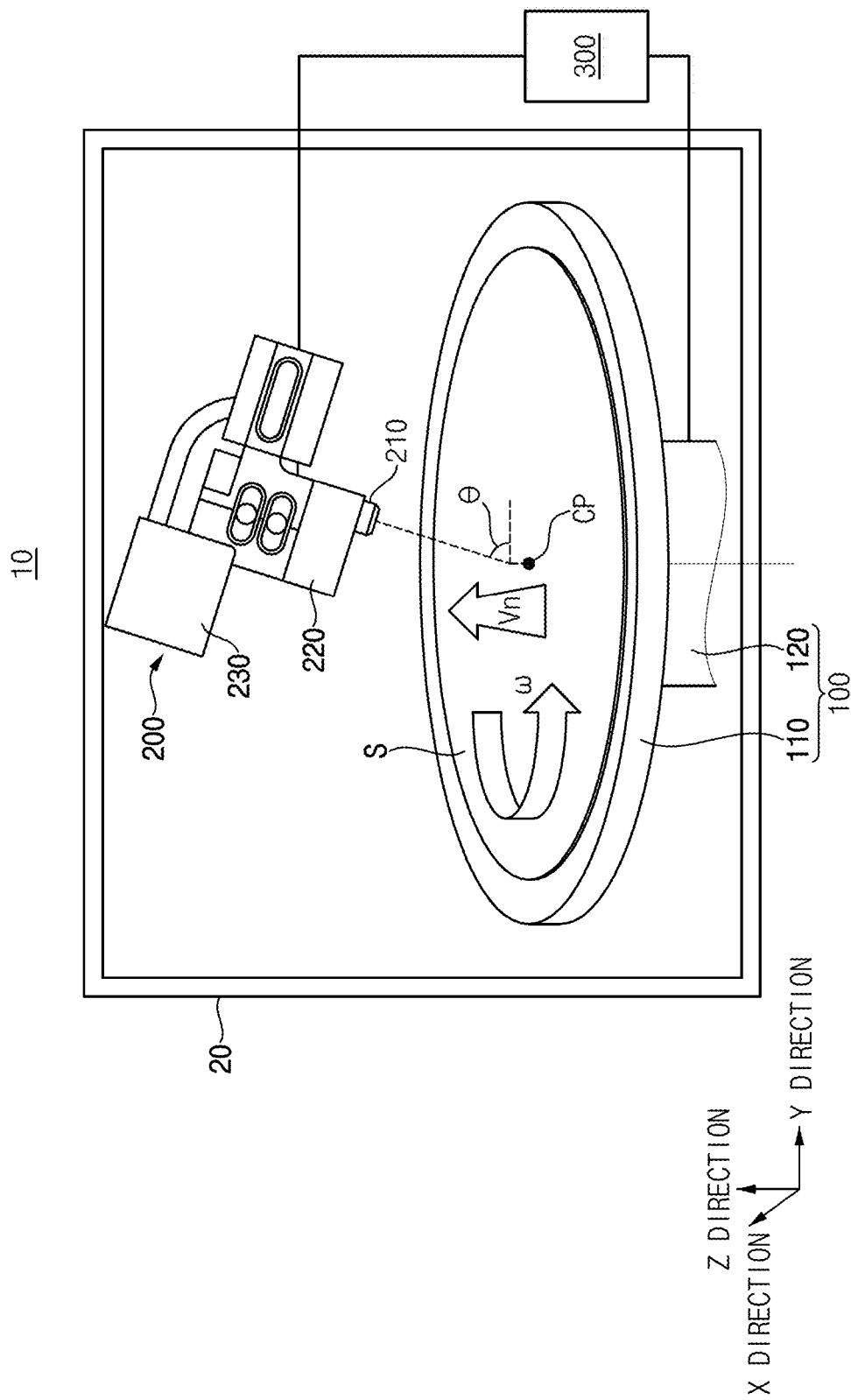
Figure 2:
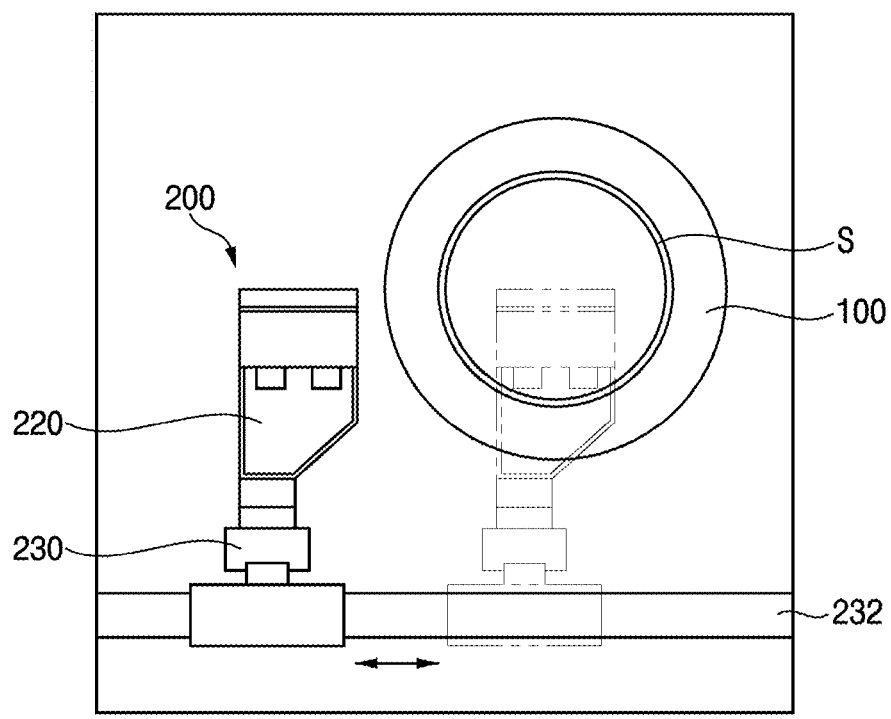
FIG. 2 is a view illustrating a moving process of the nozzle arm in FIG. 1.
Figure 3:
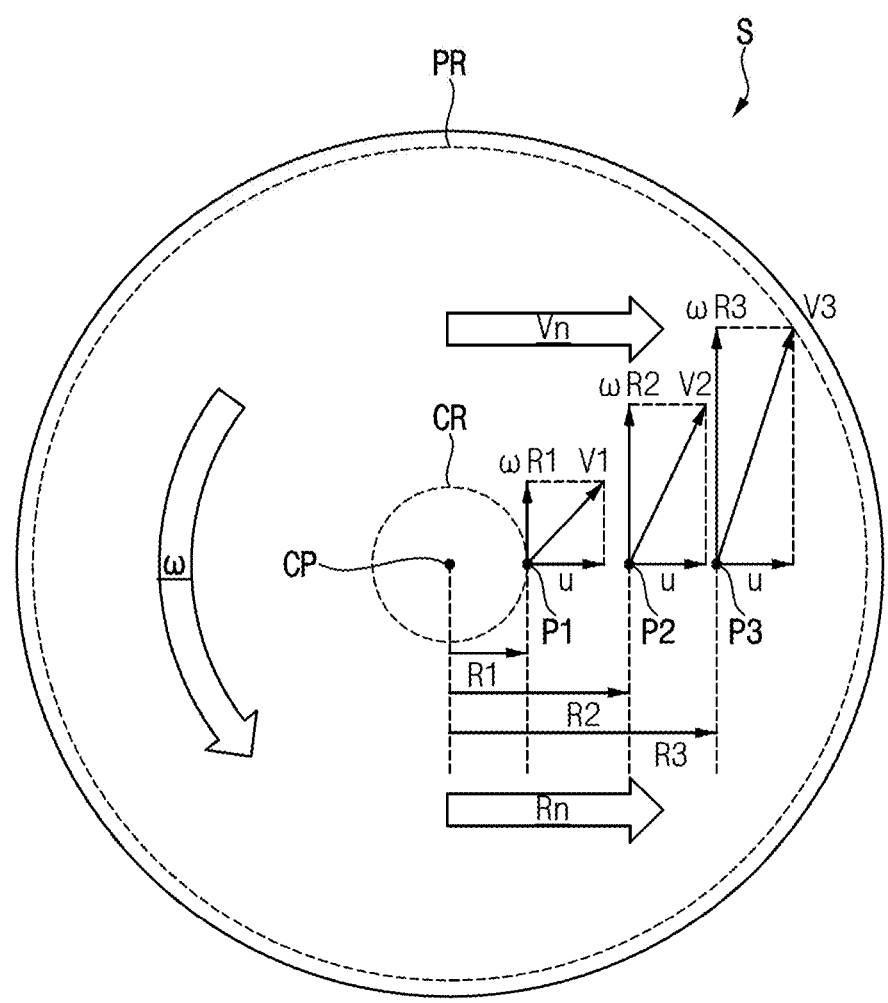
FIG. 3 is a view illustrating a process in which the discharge device in FIG. 1 discharges a chemical solution.
Figure 4A:
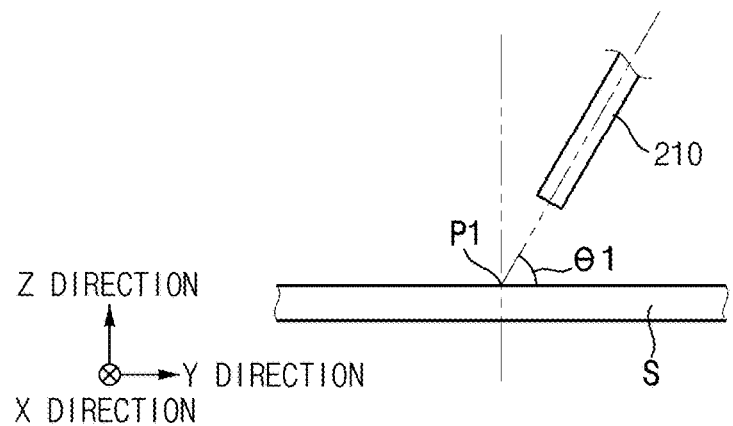
FIGS. 4A to 4C are views illustrating a process in which a predetermined angle of the nozzle in FIG. 1 decreases.
Figure 4B:
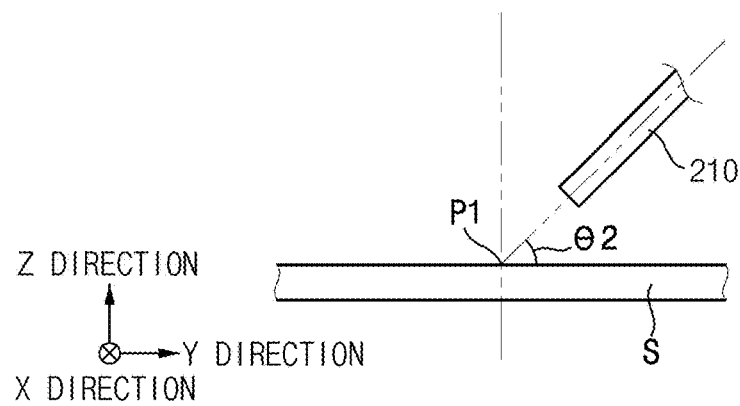
Figure 4C:
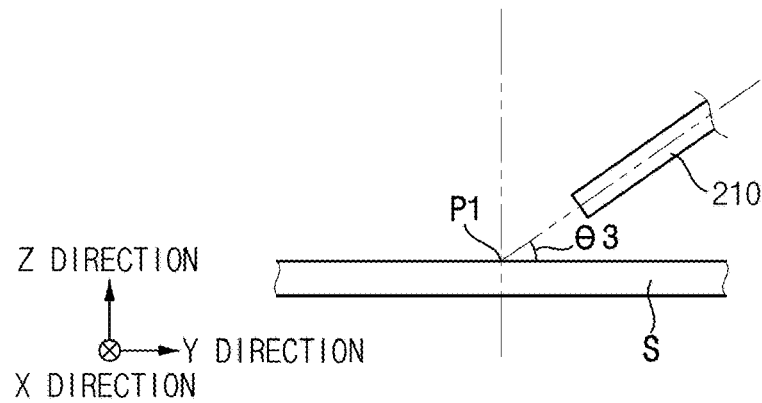

FIGS. 1A and 1B are views illustrating a substrate processing apparatus in accordance with example embodiments. FIG. 2 is a view illustrating a moving process of the nozzle arm in FIG. 1. FIG. 3 is a view illustrating a process in which the discharge device in FIG. 1 discharges a chemical solution. FIGS. 4A to 4C are views illustrating a process in which a predetermined angle of the nozzle in FIG. 1 decreases.

Referring to FIGS. 1-3 and 4A-4C, a substrate processing apparatus 10 may include a chamber 20 providing a space for performing a semiconductor device manufacturing process on a semiconductor substrate S, a substrate stage 100 provided in the chamber 20 to support the semiconductor substrate S, a discharge device 200 configured to discharge a chemical solution L onto the semiconductor substrate S disposed on the substrate stage 100, and a control device 300 configured to control the substrate stage 100 and the discharge device 200.

In example embodiments, the substrate processing apparatus 10 may include a track system for forming a photoresist layer and forming a photoresist pattern from the photoresist layer, and an exposure system for forming a photoresist pattern area by irradiating light onto the photoresist layer. The substrate processing apparatus 10 may be referred to as an apparatus capable of performing a lithography process of drawing a circuit using the light on the semiconductor substrate.

In example embodiments, the substrate processing apparatus 10 may perform a development process. In the development process, at least a portion of the photoresist layer formed on the semiconductor substrate S may be selectively removed using a development solution. The substrate processing apparatus 10 may uniformly apply the development solution on the semiconductor substrate S.

In example embodiments, the substrate processing apparatus 10 may be used as a cleaning apparatus capable of cleaning the semiconductor substrate S. The substrate processing apparatus 10 may discharge the chemical solution L onto the semiconductor substrate S to remove foreign substances on the semiconductor substrate S. In this case, the chemical solution L may include a cleaning liquid.

For example, the cleaning liquid may include deionized water (DIW). I another example, the cleaning liquid may include ammonia ($NH_3$), sulfuric acid ($H_2SO_4$), ozone ($O_3$), hydrofluoric acid (HF), hydrogen peroxide ($H_2O_2$), and the like. The cleaning liquid may be sprayed onto the semiconductor substrate S in a liquid state or a steam state.

The exposure system may perform an exposure process. The exposure system may irradiate the light onto the photoresist layer formed on the semiconductor substrate S to form the photoresist pattern area for forming the photoresist pattern. The exposure system may align a mask on the semiconductor substrate S, and the light may be irradiated onto the mask to form the photoresist pattern area. For example, the photoresist layer may include a photosensitive material that reacts to extreme ultraviolet (EUV).

The track system may form the photoresist layer on the semiconductor substrate S, e.g., on a semiconductor wafer. The track system may form the photoresist pattern from the photoresist layer provided on the semiconductor substrate S. For example, the semiconductor substrate S may include a silicon wafer having features with irregular surface topography formed thereon.

In example embodiments, the substrate stage 100 may support the semiconductor substrate S, and may rotate at a predetermined angular velocity ω. The substrate stage 100 may be disposed in the chamber 20 for performing the semiconductor device manufacturing process on the semiconductor substrate S. The substrate stage 100 may include a platen 110 configured to support the semiconductor substrate S, and a shaft 120 configured to rotate the platen 110.

The semiconductor substrate S may be disposed on an upper surface of the platen 110. The platen 110 may be supported by the shaft 120. In the semiconductor device manufacturing process, the semiconductor substrate S may be disposed on the upper surface of the platen 110. In the semiconductor device manufacturing process, a lower surface of the semiconductor substrate S and the upper surface of the platen 110 may directly contact each other.

The platen 110 may rotate by receiving a rotational force from the shaft 120. The platen 110 may rotate clockwise or counterclockwise by the shaft 120. The platen 110 may rotate at the predetermined angular velocity ω by the shaft 120. The semiconductor substrate S disposed on the platen 110 may rotate at the predetermined angular velocity ω by the platen 110.

The platen 110 may evenly apply the chemical solution L on the semiconductor substrate S through the rotational force. The chemical solution L discharged onto the semiconductor substrate S may be applied through centrifugal force by the rotational force of the platen 110.

The substrate stage 100 may receive a first control signal from the control device 300. The shaft 120 of the substrate stage 100 may change the predetermined angular velocity ω by the first control signal. The predetermined angular velocity ω of the shaft 120 may be changed in real time by the first control signal. The predetermined angular velocity ω of the shaft 120 may be continuously changed by the first control signal.

In example embodiments, the substrate stage 100 may further include a substrate holder. The substrate holder may detachably grip and fix the semiconductor substrate S on the platen 110. The substrate holder may prevent the semiconductor substrate S from being separated from the platen 110 by the rotational force.

In example embodiments, the discharge device 200 may include at least one nozzle 210 configured to discharge the chemical solution L on the semiconductor substrate S, an angle changer 220 configured to change a predetermined angle θ of the nozzle 210 from a surface of the semiconductor substrate S, and a nozzle arm 230 configured to hold the nozzle 210 and to move along the rail 232 (FIG. 2). For example, as illustrated in FIG. 1B, the nozzle 210 may face the upper surface of the platen 110 of the substrate stage 100, and the angle changer 220 may change the predetermined angle θ of the nozzle 210 relative to the upper surface of the semiconductor substrate S, e.g., relative to the upper surface of the platen 110 of the substrate stage 100.

The discharge device 200 may discharge the chemical solution L onto the semiconductor substrate S through the at least one nozzle 210. The discharge device 200 may move while discharging the chemical solution L. Since the discharge device 200 moves while discharging the chemical solution L, the chemical solution L may be evenly applied on the semiconductor substrate S.

Referring to FIG. 3, the nozzle arm 230 may move the nozzle 210 along a radial direction from a center CP of the semiconductor substrate S (e.g., along the X direction). The nozzle arm 230 may move from a central region CR of the semiconductor substrate S (e.g., from a central region of the substrate stage that overlaps the central region CR of the semiconductor substrate S) to a peripheral region PR surrounding the central region CR (e.g., to a peripheral region of the substrate stage that overlaps the peripheral region PR of the semiconductor substrate S). The nozzle arm 230 may move the nozzle 210 from the central region CR to the peripheral region PR to evenly distribute the chemical solution L on the semiconductor substrate S.

In this specification, a direction (the radial direction) in which the nozzle arm 230 moves is referred to as a first horizontal direction (X direction), a direction orthogonal to the first horizontal direction (X direction) is referred to as a second horizontal direction (Y direction), and a direction orthogonal to both the first horizontal direction and the second horizontal direction is referred to as a vertical direction (Z direction).

The nozzle arm 230 may start moving along the rail 232 from the center CP of the semiconductor substrate S. The nozzle 210 may be spaced apart from the center CP of the semiconductor substrate S for a predetermined distance Rn by the moving nozzle arm 230. The nozzle arm 230 may start moving along the radial direction (X direction) in a state where the nozzle 210 is stopped at the center CP of the semiconductor substrate S. Since the nozzle arm 230 starts in the stopped state, the nozzle arm 230 may perform a uniformly accelerated motion in which a speed gradually increases in the central region CR. The nozzle arm 230 may perform the uniformly accelerated motion until a predetermined time period τ.

The nozzle arm 230 may move at a predetermined speed Vn in the peripheral region PR. The nozzle arm 230 may constantly maintain the predetermined speed Vn to evenly apply the chemical solution L on the semiconductor substrate S. The nozzle arm 230 may perform a uniform motion in which the speed is maintained constant in the peripheral region PR. Alternatively, the nozzle arm 230 may continuously decrease the predetermined speed Vn to evenly apply the chemical solution L on the semiconductor substrate S. The predetermined speed Vn may decrease exponentially.

The nozzle 210 may move at the predetermined speed Vn by the nozzle arm 230. Since the nozzle 210 moves at the predetermined speed Vn on the semiconductor substrate S, a landing point of the chemical solution L discharged from the nozzle 210 and contacting the semiconductor substrate S may move. Since the nozzle 210 moves at the predetermined speed Vn and the substrate stage 100 rotates at the predetermined angular velocity ω, a linear velocity on the semiconductor substrate S at the landing point of the chemical solution L may vary.

For example, the nozzle 210 may sequentially move from the center CP of the semiconductor substrate S to a first landing point P1, a second landing point P2, and a third landing point P3. The nozzle 210 may reach the first landing point P1 at the predetermined time period t. The first landing point P1 may be provided on a boundary between the central region CP and the peripheral region PR of the semiconductor substrate S.

At the first to third landing points P1, P2, and P3, the nozzle arm 230 may move at the predetermined speed Vn. At the first to third landing points P1, P2, and P3, the nozzle 210 may move at the predetermined speed Vn through the nozzle arm 230. The first landing point P1 may be spaced apart from the center CP of the semiconductor substrate S by a first distance R1. The second landing point P2 may be spaced apart from the center CP of the semiconductor substrate S by a second distance R2. The third landing point P3 may be spaced apart from the center CP of the semiconductor substrate S by a third distance R3.

The linear velocity of the semiconductor substrate S may be a product of the predetermined angular velocity ω and the distance from the center CP of the semiconductor substrate S. At the first landing point P1, the semiconductor substrate S may have a first linear velocity ωR1. At the second landing point P2, the semiconductor substrate S may have a second linear velocity ωR2. At the second landing point P2, the semiconductor substrate S may have a third linear velocity ωR3. The first to third linear velocities ωR1, ωR2, and ωR3 may sequentially increase.

Since the substrate stage 100 has the predetermined angular velocity ω and the discharge device 200 moves at the predetermined speed Vn, the landing speed of the chemical solution L may be different at the first to third landing points P1, P2, and P3. The chemical solution L may have a first landing speed V1 at the first landing point P1. The chemical solution L may have a second landing speed V2 at the second landing point P2. The chemical solution L may have a third landing speed V3 at the third landing point P3.

The nozzle 210 may discharge the chemical solution L onto the semiconductor substrate S at the predetermined angle θ (e.g., a spray angle) from the surface of the semiconductor substrate S. The nozzle 210 may be provided on the angle changer 220.

The angle changer 220 provided with the nozzle 210 may rotate and change a discharging angle of the nozzle 210. The angle changer 220 may change the predetermined angle θ of the nozzle 210.

As illustrated in FIGS. 4A to 4C, the predetermined angle θ of the nozzle 210 may be inclined toward a linear velocity direction (Y direction) of the semiconductor substrate S. Since the predetermined angle θ of the nozzle 210 is inclined in the linear velocity direction, a difference between the landing speed of the chemical solution L and the linear velocity of the semiconductor substrate S may decrease.

The predetermined angle θ may vary according to a position of the nozzle 210. The predetermined angle θ may vary according to the predetermined angular velocity ω of the substrate stage 100. Since the linear velocity of the semiconductor substrate S increases as the nozzle 210 moves from the central region CR to the peripheral region PR, the predetermined angle θ of the nozzle 210 may decrease (e.g., the predetermined angle θ may decrease from θ1 to θ2 to θ3).

Since the predetermined angle θ of the nozzle 210 decreases, a difference between the landing speed of the chemical solution L and the first to third linear velocities ωR1, ωR2, and ωR3 of the semiconductor substrate S may decrease. Since the predetermined angle θ of the nozzle 210 decreases, a backflow phenomenon or a splashing phenomenon occurring in the chemical solution L may be reduced.

The angle changer 220 may receive a second control signal from the control device 300. The angle changer 220 may change the predetermined angle θ of the nozzle 210 according to the second control signal. The predetermined angle θ of the nozzle 210 may be changed in real time by the second control signal. The predetermined angle θ of the nozzle 210 may be continuously changed by the second control signal.

The angle changer 220 may gradually decrease the predetermined angle θ of the nozzle 210 as the nozzle 210 moves from the central region CR to the peripheral region PR. For example, the predetermined angle θ may be within a range of 30 degrees to 90 degrees.

The predetermined speed Vn may vary according to the position of the nozzle 210. The nozzle arm 230 may gradually decrease the predetermined speed Vn as the nozzle arm 230 moves from the central region CR to the peripheral region PR. The predetermined speed Vn may vary according to the predetermined angular velocity ω of the substrate stage 100. The predetermined speed Vn may be reduced by a same mechanism as the predetermined angular velocity ω of the substrate stage 100.

Since the linear velocity of the semiconductor substrate S increases as the nozzle 210 moves from the central region CR to the peripheral region PR, the predetermined speed Vn of the nozzle arm 230 may decrease. Since the predetermined speed Vn of the nozzle arm 230 decreases, the backflow phenomenon or the splashing phenomenon occurring in the chemical solution L may be reduced.

The nozzle arm 230 may receive a third control signal from the control device 300. The nozzle arm 230 may change the predetermined speed Vn according to the third control signal. The predetermined speed Vn of the nozzle arm 230 may be changed in real time by the third control signal. The predetermined speed Vn of the nozzle arm 230 may be continuously changed by the third control signal.

The nozzle 210 may discharge the chemical solution L in the linear velocity direction (Y direction) in which the semiconductor substrate S rotates. Since the nozzle 210 discharges the chemical solution L in the linear velocity direction, a difference between a discharged speed of the chemical solution L that is discharged from the nozzle 210 and the predetermined angular velocity ω of the substrate stage 100 may be reduced.

Since the difference between the discharged speed of the chemical solution L and the predetermined angular velocity ω of the substrate stage 100 is reduced, the backflow phenomenon or the splashing phenomenon occurring in the chemical solution L may be reduced. Since the difference between the discharged speed of the chemical solution L and the predetermined angular velocity ω of the substrate stage 100 is reduced, a viscous force of the chemical solution L in contact with the semiconductor substrate S may increase.

Hereinafter, a process in which the substrate stage 100 changes the angular velocity ω according to a movement of the nozzle 210 will be described in detail.

Figure 5A:
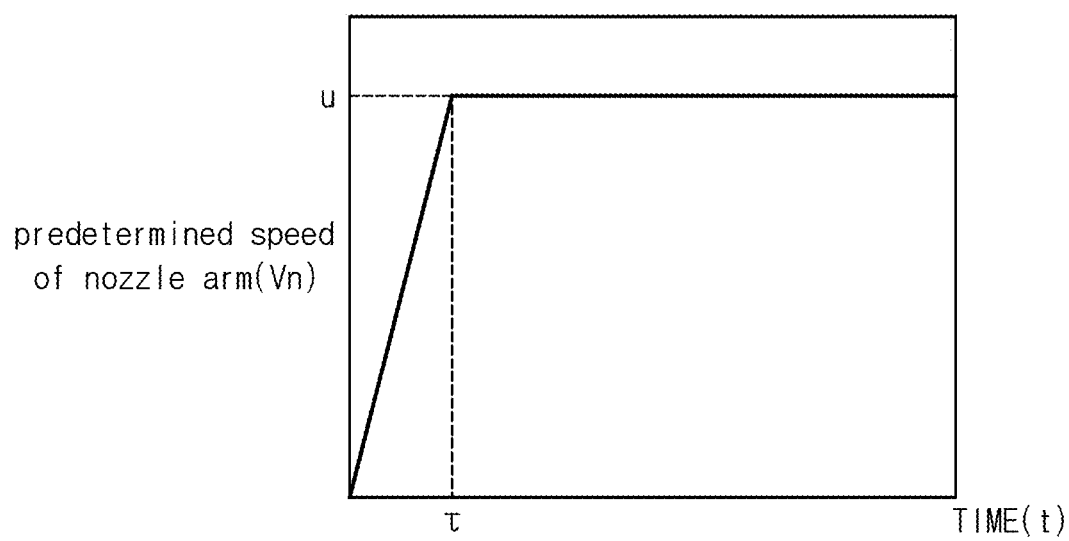
FIG. 5A is a graph illustrating a predetermined speed of a nozzle arm over time.
Figure 5B:
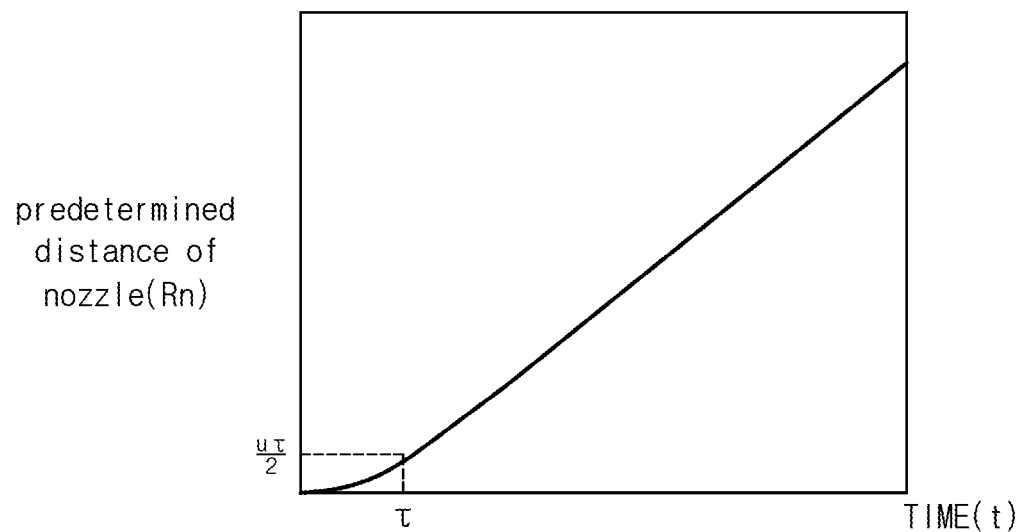
FIG. 5B is a graph illustrating a distance of a nozzle from a center of a semiconductor device over time.
Figure 5C:
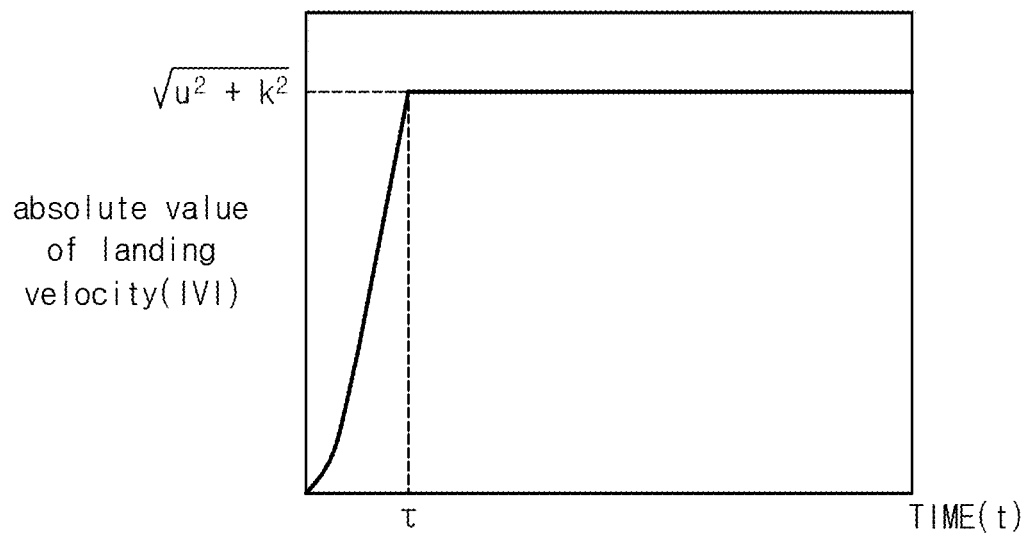
FIG. 5C is a graph illustrating a landing speed of a chemical solution over time.
Figure 5D:
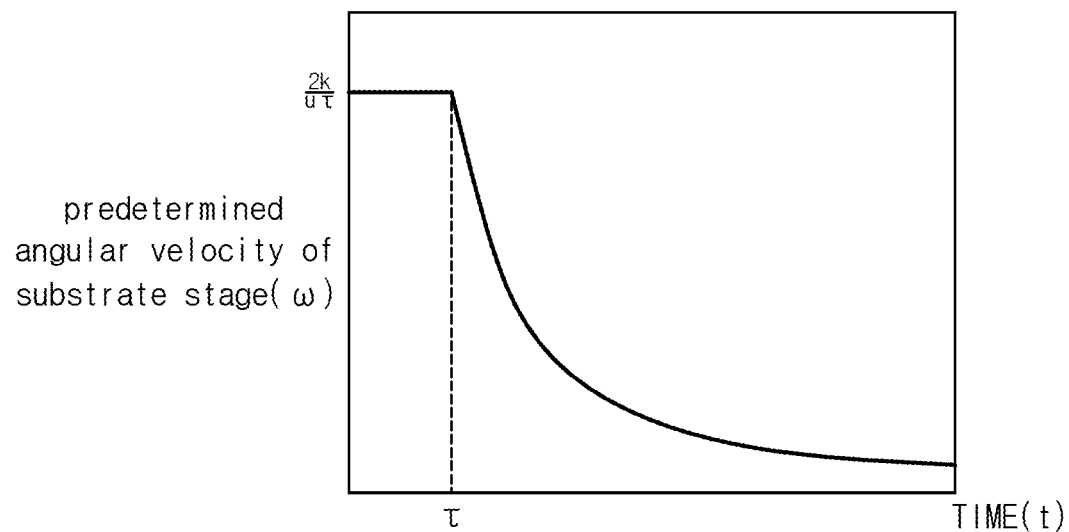
FIG. 5D is a graph illustrating an angular velocity of a semiconductor substrate over time.

FIG. 5A is a graph illustrating a predetermined speed of the nozzle arm 230 over time. FIG. 5B is a graph illustrating a distance of the nozzle 210 from a center of a semiconductor device over time. FIG. 5C is a graph illustrating a landing speed of the chemical solution L over time. FIG. 5D is a graph illustrating an angular velocity of the semiconductor substrate S over time.

Referring to FIGS. 1 to 5, the predetermined angular velocity ω of the substrate stage 100 may vary according to a position of the nozzle arm 230. The control device 300 may continuously change the predetermined angular velocity ω of the substrate stage 100 to prevent the backflow phenomenon or the splashing phenomenon of the chemical solution L.

Referring to FIG. 5A, the nozzle arm 230 may move with a uniformly accelerated motion (i.e., at a constant acceleration) until the predetermined time period T. The nozzle arm 230 may move in a uniform motion (i.e., at a constant velocity) after the predetermined time period τ. The predetermined speed Vn of the nozzle arm 230 until the predetermined time period τ may be defined by following Equation (1), and the predetermined speed Vn of the nozzle arm 230 after the predetermined time period T may be defined by following Equation (2).

$$Vn = \frac{ut}{\tau} \quad (0 \leq t < \tau) \qquad \text{Equation (1)}$$

$$Vn = u \quad (\tau \leq t) \qquad \text{Equation (2)}$$

Here, Vn is the predetermined speed of the nozzle arm 230, t is time, τ is the predetermined time period, and u is the predetermined speed of the nozzle arm 230.

Referring to FIG. 5B, the nozzle 210 may be spaced apart from the center CP of the semiconductor substrate S for the predetermined distance Rn by the moving nozzle arm 230. The nozzle 210 may move up to the first distance R1 by the predetermined time period τ. The predetermined distance Rn of the nozzle 210 may constantly increase after the predetermined time period τ. The predetermined distance Rn of the nozzle 210 until the predetermined time period τ may be defined by following Equation (3), and the predetermined distance Rn of the nozzle 210 after the predetermined time period τ may be defined by following Equation (4).

$$Rn = \frac{ut^2}{2\tau} \quad (0 \leq t < \tau) \qquad \text{Equation (3)}$$

$$Rn = u\left(t - \frac{\tau}{2}\right) \quad (\tau \leq t) \qquad \text{Equation (4)}$$

Here, Rn is the predetermined distance of the nozzle 210, t is time, τ is the predetermined time period, and u is the predetermined speed of the nozzle arm 230.

Referring to FIG. 5C, the moving nozzle 210 may discharge the chemical solution L onto the semiconductor substrate S. A landing velocity V of the chemical solution L may vary according to the position of the nozzle arm 230. The landing velocity V of the chemical solution L may vary depending on the position of the nozzle 210. A vector value of the landing velocity V of the chemical solution L may be defined by following Equation (5), an absolute value of the landing velocity V of the chemical solution L may be defined by following Equation (6).

$$\vec{V} = Vn\vec{i} + \omega Rn\vec{j} \qquad \text{Equation (5)}$$

$$|\vec{V}| = \sqrt{Vn^2 + (\omega Rm)^2} \qquad \text{Equation (6)}$$

The absolute value of the landing velocity V up to the predetermined time period τ may be defined by following Equation (7), and the absolute value of the landing velocity V from after the predetermined time period τ may be defined by following Equation (8). Since the absolute value of the landing velocity V from after the predetermined time period τ is defined by equation (8), the absolute value of the landing speed V may be kept constant regardless of the position of the nozzle 210. Since the absolute value of the landing speed V is kept constant, the backflow phenomenon or the splashing phenomenon occurring in the chemical solution L may be reduced.

$$|\vec{V}| = \frac{t}{\tau}\sqrt{u^2 + \left(\frac{kt}{\tau}\right)^2} \quad (0 \leq t < \tau) \qquad \text{Equation (7)}$$

-continued $$|\vec{V}| = \sqrt{u^2 + k^2} \quad (\tau \le t)$$ Equation (8)

Here, V is the landing velocity of the chemical solution, |V| is the absolute value of the landing speed, k is a constant, t is time, τ is the predetermined time period, and u is the predetermined speed of the nozzle arm.

Referring to FIG. 5D, the predetermined angular velocity ω of the substrate stage 100 may be changed. The predetermined angular velocity ω of the substrate stage 100 may be continuously varied to keep the absolute value of the landing velocity V. The predetermined angular velocity ω until the predetermined time period τ may be defined by following Equation (9), and the predetermined angular velocity ω from after the predetermined time period τ may be defined by following Equation (10).

$$\omega = \frac{2k}{u\tau} \quad (0 \le t < \tau)$$ Equation (9)

$$\omega = \frac{k}{u\left(t - \frac{\tau}{2}\right)} \quad (\tau \le t)$$ Equation (10)

Here, ω is the predetermined angular velocity, k is a constant, t is time, τ is the predetermined time period, and u is the predetermined speed of the nozzle arm 230.

Since the predetermined angular velocity ω from after the predetermined time period τ is defined by the above equation (10), the predetermined angular velocity ω may decrease exponentially. Since the predetermined angular velocity ω decreases exponentially, the absolute value of the landing velocity V may be kept constant, the backflow phenomenon or the splashing phenomenon occurring in the chemical solution L may be reduced.

In example embodiments, the control device 300 may continuously change the predetermined speed Vn of the nozzle arm 230 to prevent the backflow phenomenon or the splashing phenomenon of the chemical solution L. The predetermined speed Vn of the nozzle arm 230 may be controlled by the same mechanism as the predetermined angular velocity ω of the substrate stage 100.

Since the predetermined angular velocity ω of the substrate stage 100 and the predetermined speed Vn of the nozzle arm 230 change dynamically according to the position of the nozzle 210, the substrate processing apparatus 10 may uniformly apply the chemical solution L on the semiconductor substrate S The substrate processing apparatus 10 may apply the chemical solution L on the semiconductor substrate S to maintain durability of circuit patterns formed on the semiconductor substrate S. The substrate processing apparatus 10 may apply the chemical solution L on the semiconductor substrate S to remove contaminant particles (scum) formed on the semiconductor substrate S. The substrate processing apparatus 10 may optimally control the predetermined angular velocity ω and the predetermined speed Vn to remove the contaminant particles while maintaining the durability of the circuit pattern.

Figure 6A:
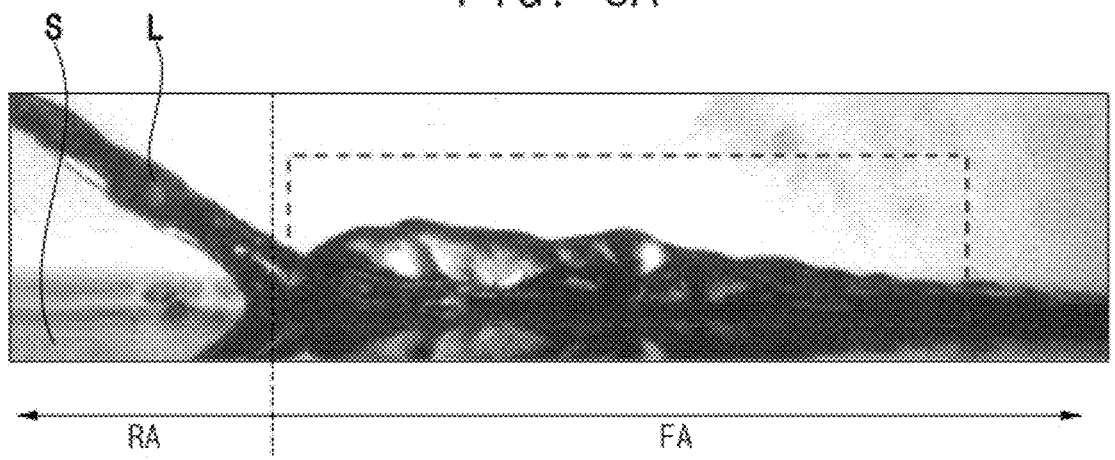
FIGS. 6A-6C and 7A-7C are enlarged views illustrating fluidity of a chemical solution when a nozzle is a slit nozzle.
Figure 6B:
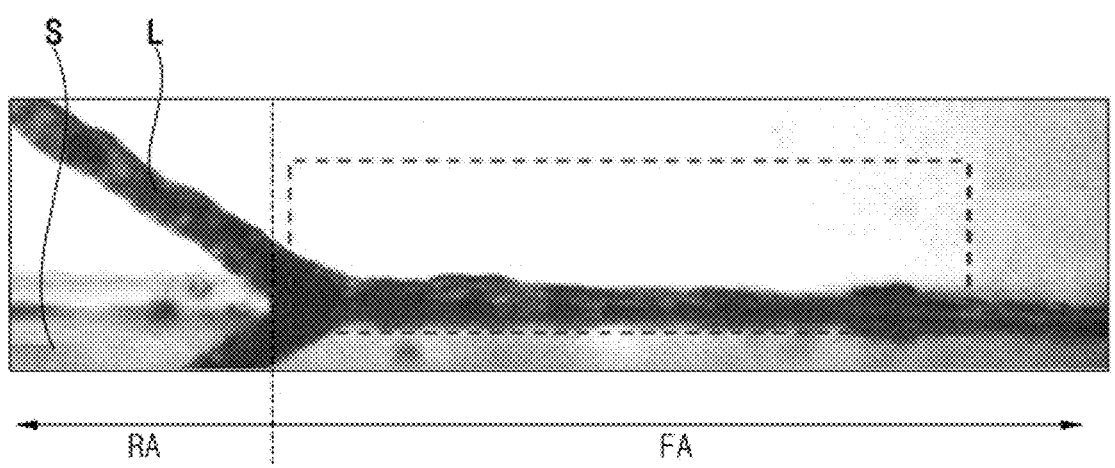
Figure 6C:
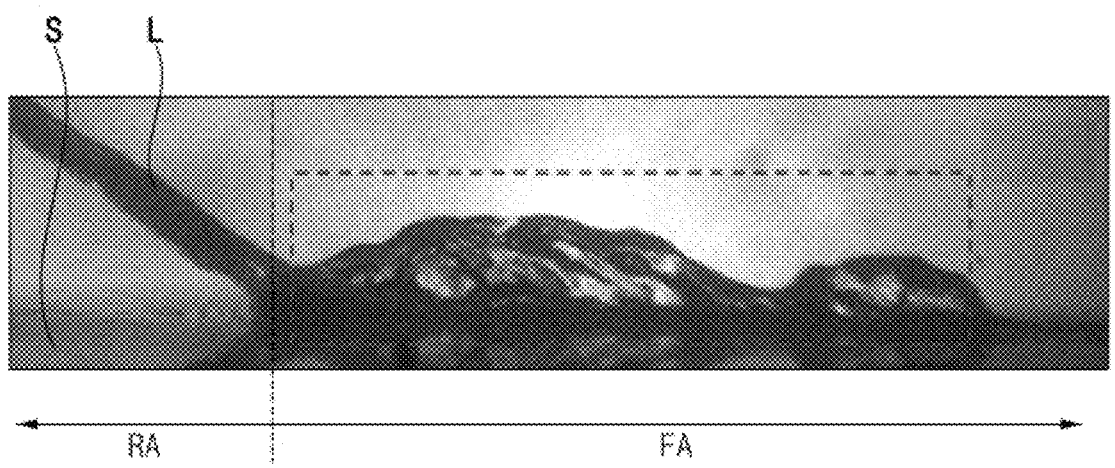

FIGS. 6A-6C and 7A-7C are enlarged views illustrating fluidity of a chemical solution when a nozzle is a slit nozzle. FIG. 6A is an enlarged view illustrating an upwash phenomenon occurring in a front region of a chemical solution. FIG. 6B is an enlarged view illustrating a landing phenomenon occurring in a front region of a chemical solution. FIG. 6C is an enlarged view illustrating a bouncing phenomenon occurring in a front region of a chemical solution.

Referring to FIGS. 1A-1B and 6A-6C, an upwash phenomenon, a landing phenomenon, or a bouncing phenomenon may occur in a front region FA of the chemical solution L. When the landing phenomenon occurs in the chemical solution L, the chemical solution L may be evenly applied on the semiconductor substrate S. When the upwash phenomenon or the bouncing phenomenon occurs in the chemical solution L, the chemical solution L may cause defects in the semiconductor substrate S, e.g., due to an uneven application of the chemical solution L on the semiconductor substrate S.

In example embodiments, the nozzle 210 may include a slit nozzle. The slit nozzle may discharge the chemical solution L from a rectangular outlet. The slit nozzle may discharge the chemical solution L evenly on the semiconductor substrate S through the rectangular outlet.

As illustrated in FIG. 6A, the upwash phenomenon may occur in the front region FA of the chemical solution L. In this case, a flow rate Q of the chemical solution L may be 400 Mlpm (mL/min), a linear velocity Vw of the substrate stage 100 may be 7.3 m/s, and the predetermined angle θ of the nozzle 210 may be 30 degrees.

As illustrated in FIG. 6B, when the nozzle 210 is the slit nozzle, the landing phenomenon may occur in the front region FA of the chemical solution L. When the landing phenomenon occurs in the chemical solution L, the chemical solution L may be stably applied on the semiconductor substrate S. In this case, the flow rate Q of the chemical solution L may be 600 Mlpm, the linear velocity Vw of the substrate stage 100 may be 7.3 m/s, and the predetermined angle θ of the nozzle 210 may be 30 degrees.

As illustrated in FIG. 6C, when the nozzle 210 is the slit nozzle, the bouncing phenomenon may occur in the front region FA of the chemical solution L. In this case, the flow rate Q of the chemical solution L may be 400 Mlpm, the linear velocity Vw of the substrate stage 100 may be 25.7 m/s, and the predetermined angle θ of the nozzle 210 may be 30 degrees.

Figure 7A:
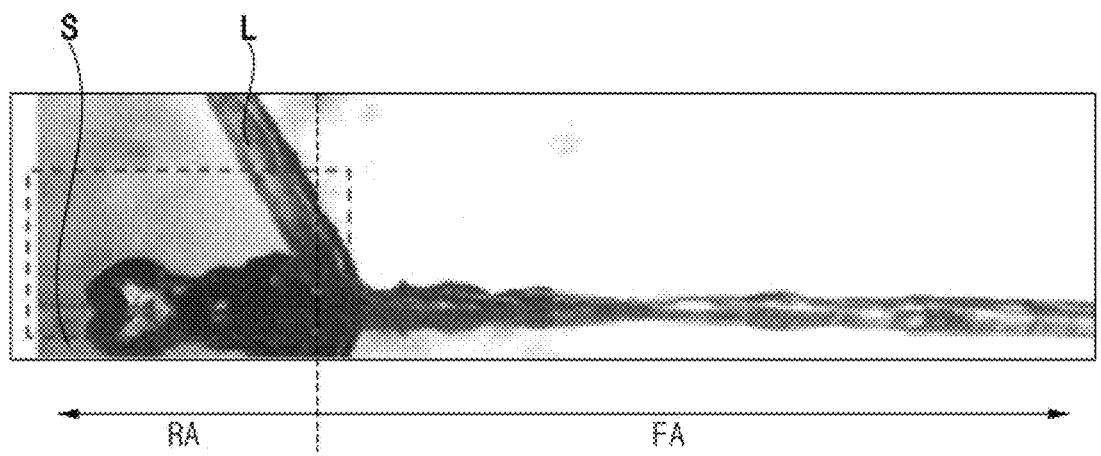
Figure 7B:
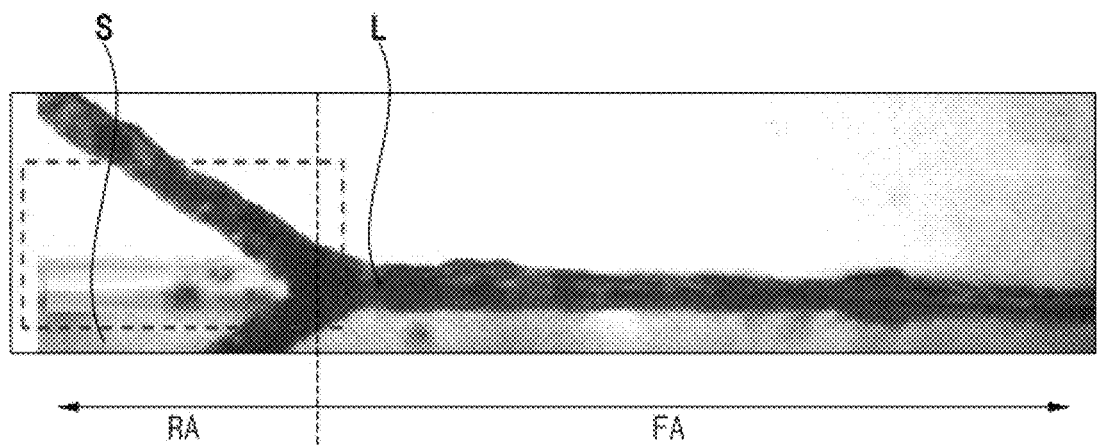
Figure 7C:
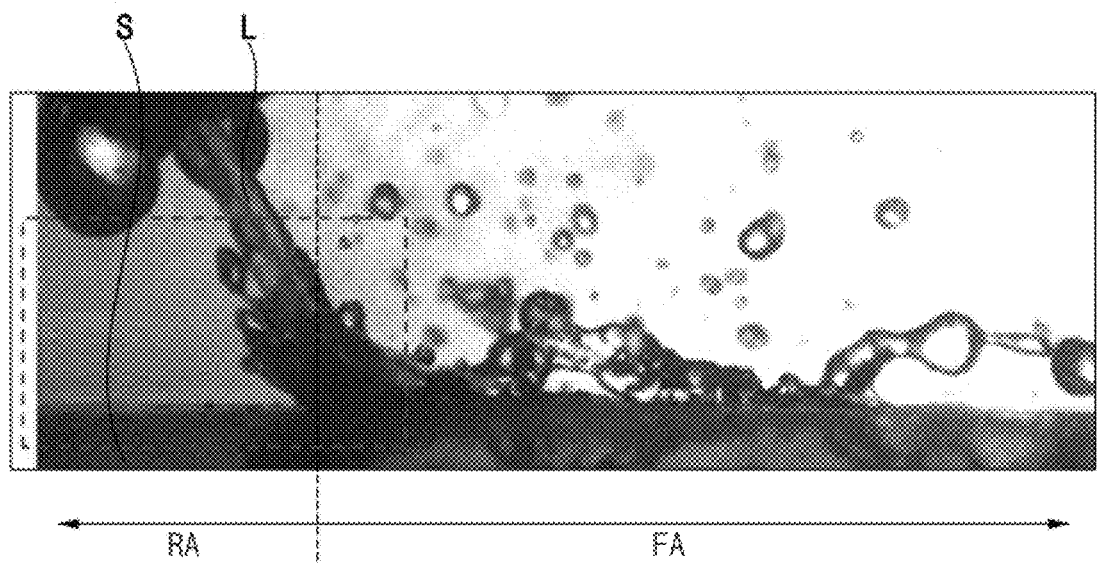

FIG. 7A is an enlarged view illustrating a backflow phenomenon occurring in a rear region of a chemical solution. FIG. 7B is an enlarged view illustrating a non-backflow phenomenon occurring in a rear region of a chemical solution. FIG. 7C is an enlarged view illustrating a splashing phenomenon occurring in a rear region of a chemical solution.

Referring to FIGS. 1A-1B and 7A-7C, a backflow phenomenon, a non-backflow phenomenon, or a splashing phenomenon may occur in a rear region RA of the chemical solution L. When the non-backflow phenomenon occurs in the chemical solution L, the chemical solution L may be evenly applied on the semiconductor substrate S. When the backflow phenomenon or the splashing phenomenon occurs in the chemical solution L, the chemical solution L may cause the defects in the semiconductor substrate S.

As illustrated in FIG. 7A, when the nozzle 210 is the slit nozzle, the backflow phenomenon may occur in the rear region RA of the chemical solution L. In this case, the flow rate Q of the chemical solution L may be 600 Mlpm, the linear velocity Vw of the substrate stage 100 may be 7.3 m/s, and the predetermined angle θ of the nozzle 210 may be 60 degrees.

As illustrated in FIG. 7B, when the nozzle 210 is the slit nozzle, the non-backflow phenomenon may occur in the rear region RA of the chemical solution L. When the non-backflow phenomenon occurs in the chemical solution L, the chemical solution L may be stably applied on the semiconductor substrate S. In this case, the flow rate Q of the chemical solution L may be 600 Mlpm, the linear velocity Vw of the substrate stage 100 may be 7.3 m/s, and the predetermined angle θ of the nozzle 210 may be 30 degrees.

As illustrated in FIG. 7C, when the nozzle 210 is the slit nozzle, the splashing phenomenon may occur in the rear region RA of the chemical solution L. In this case, the flow rate Q of the chemical solution L may be 600 Mlpm, the linear velocity Vw of the substrate stage 100 may be 25.7 m/s, and the predetermined angle θ of the nozzle 210 may be 60 degrees.

Figure 8:
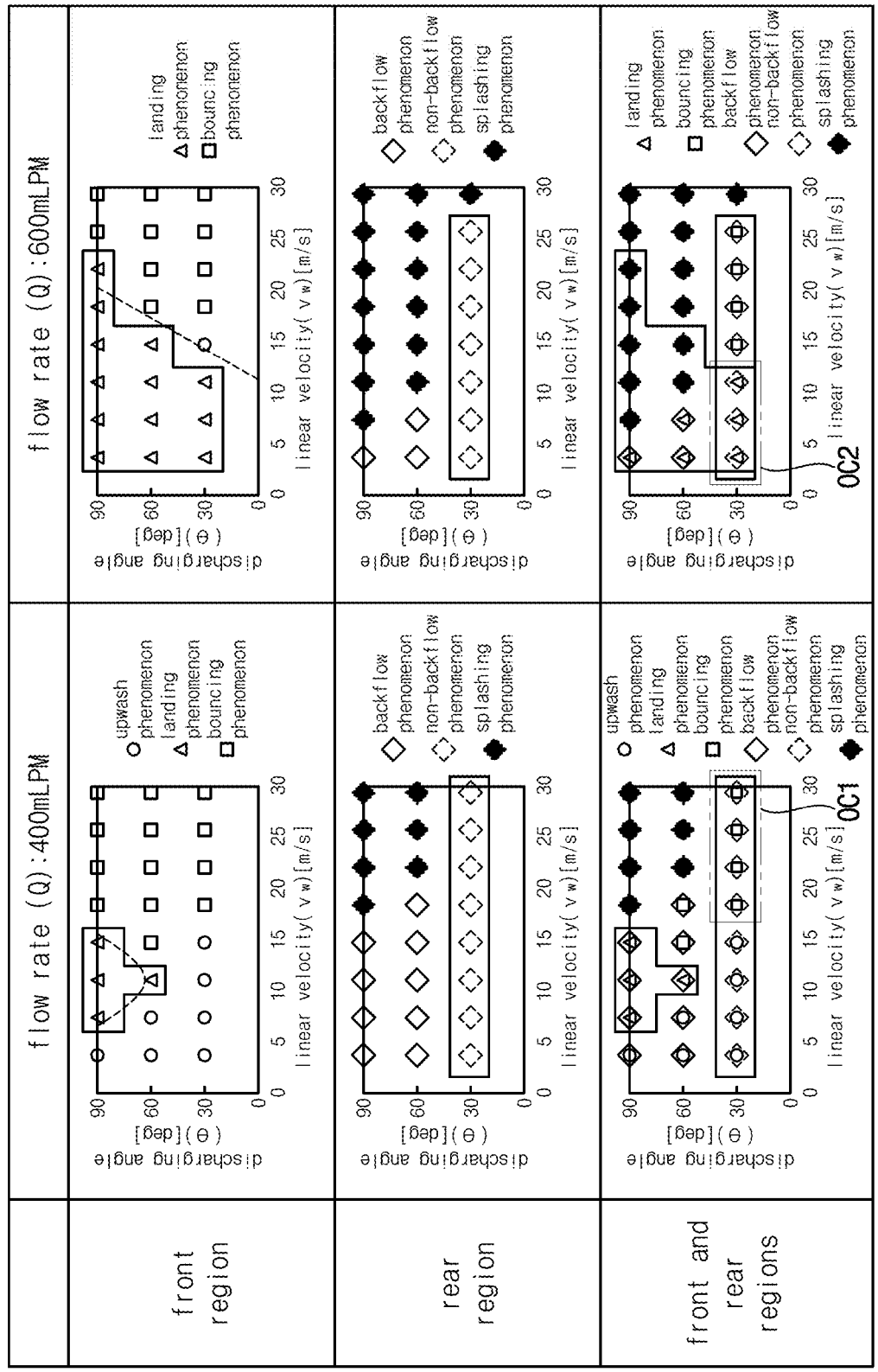
FIG. 8 is a view illustrating an optimized discharging angle and an optimized linear velocity according to a flow rate when a nozzle is a slit nozzle.

FIG. 8 is a view illustrating an optimized discharging angle and an optimized linear velocity according to a flow rate when a nozzle is a slit nozzle.

Referring to FIGS. 1A-1B and FIGS. 6A to 8, when the flow rate Q of the chemical solution L is 400 Mlpm, the predetermined angle θ of the nozzle 210 may be optimized at 25 degrees to 35 degrees. When the flow rate Q of the chemical solution L is 400 Mlpm, the predetermined angular velocity ω of the substrate stage 100 may be optimized at 15 degrees to 30 degrees. In a first optimization condition OC1, the chemical solution L may minimize the upwash phenomenon, the bouncing phenomenon, the backflow phenomenon, and the splashing phenomenon.

When the flow rate Q of the chemical solution L is 600 Mlpm, the predetermined angle θ of the nozzle 210 may be optimized at 25 degrees to 35 degrees. When the flow rate Q of the chemical solution L is 600 Mlpm, the predetermined angular velocity ω of the substrate stage 100 may be optimized at 5 degrees to 15 degrees. In a second optimization condition OC2, the chemical solution L may minimize the upwash phenomenon, the bouncing phenomenon, the backflow phenomenon, and the splashing phenomenon.

In the first optimization condition OC1 and the second optimization condition OC2, the chemical solution L may be stably applied on the semiconductor substrate S. When the nozzle 210 is the slit nozzle, the predetermined angular velocity ω of the substrate stage 100 according to the first optimization condition OC1 and the second optimization condition OC2 may decrease as the flow rate Q of the chemical solution L increases.

Figure 9A:
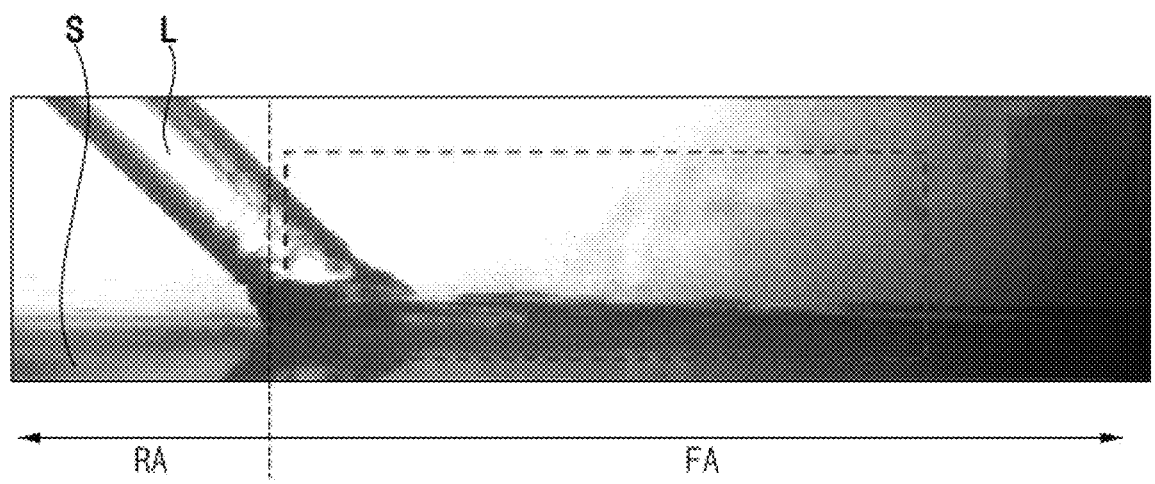
FIGS. 9A-9B and 10A-10C are enlarged views illustrating fluidity of a chemical solution when a nozzle is a circular nozzle.
Figure 9B:
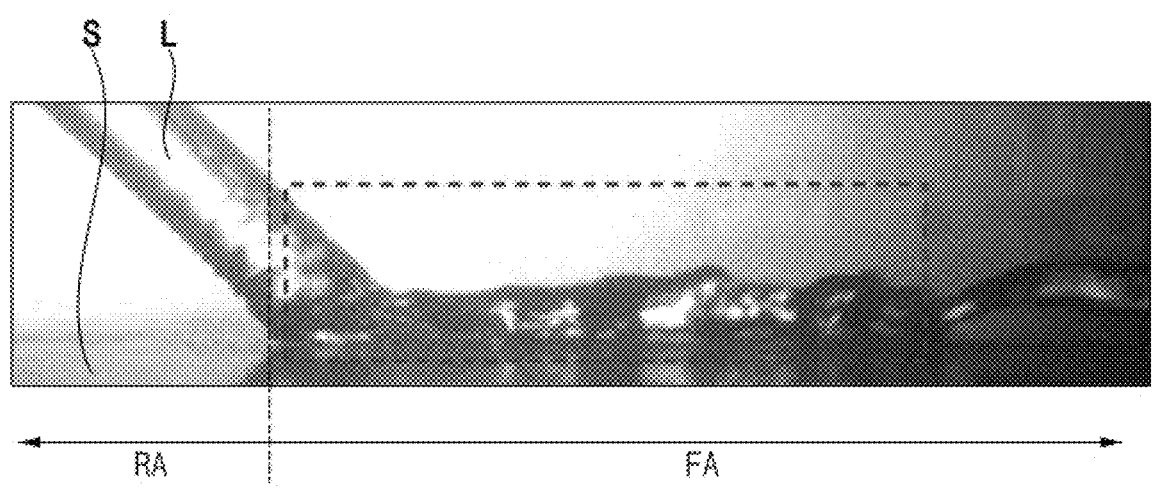

FIGS. 9A-9B and 10A-10C are enlarged views illustrating fluidity of a chemical solution when a nozzle is a circular nozzle. FIG. 9A is an enlarged view illustrating a landing phenomenon occurring in a front region of a chemical solution. FIG. 9B is an enlarged view illustrating a bouncing phenomenon occurring in a front region of a chemical solution.

Referring to FIGS. 1A-1B and 9A-9B, the nozzle 210 may include a circular nozzle. The circular nozzle may discharge the chemical solution L from a circular outlet. The circular nozzle 210 may evenly discharge the chemical solution L onto the semiconductor substrate S through the circular outlet.

As illustrated in FIG. 9A, when the nozzle 210 is the circular nozzle, the landing phenomenon may occur in the front region FA of the chemical solution L. When the landing phenomenon occurs in the chemical solution L, the chemical solution L may be stably applied onto the semiconductor substrate S. In this case, the flow rate Q of the chemical solution L may be 350 Mlpm, the linear velocity Vw of the substrate stage 100 may be 7.3 m/s, and the predetermined angle θ of the nozzle 210 may be 30 degrees.

As illustrated in FIG. 9B, when the nozzle 210 is the circular nozzle, the bouncing phenomenon may occur in the front region FA of the chemical solution L. In this case, the flow rate Q of the chemical solution L may be 350 Mlpm, the linear velocity Vw of the substrate stage 100 may be 25.7 m/s, and the predetermined angle θ of the nozzle 210 may be 30 degrees.

Figure 10A:
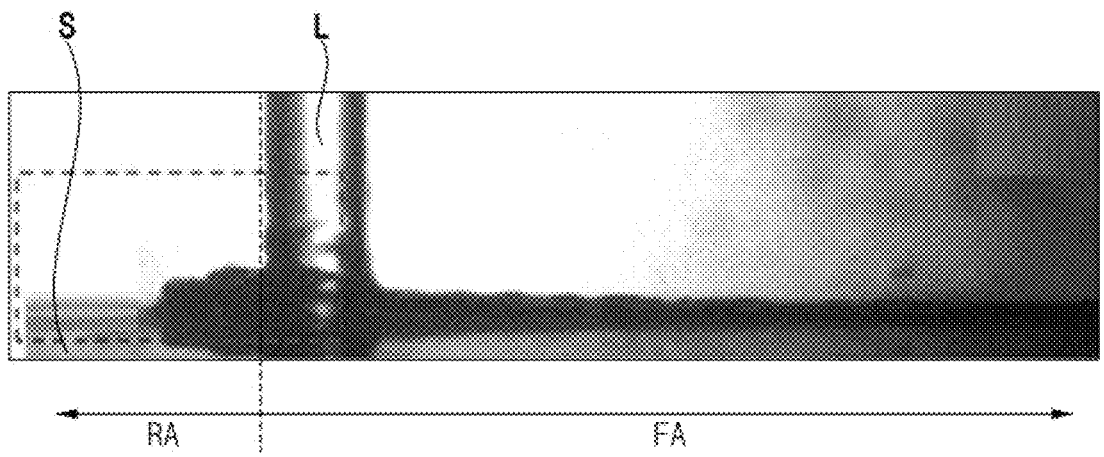
Figure 10B:
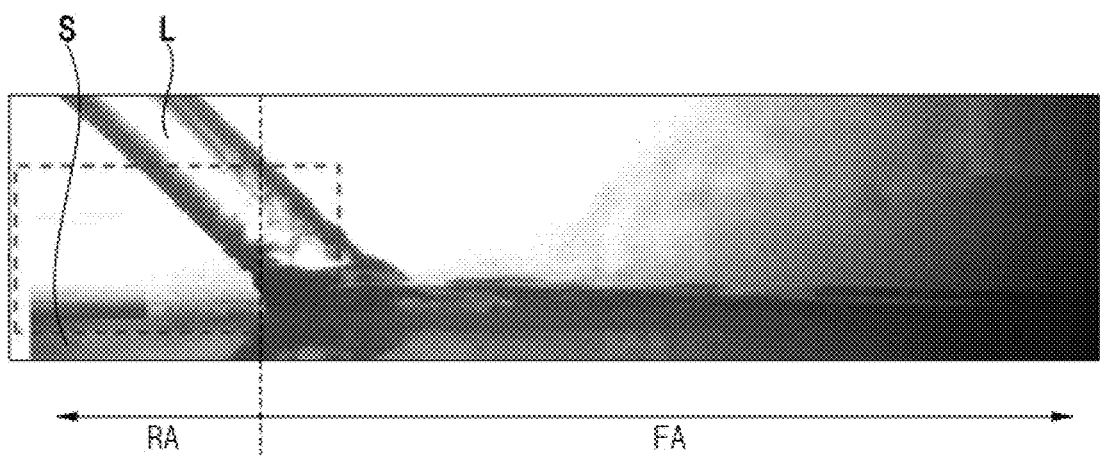
Figure 10C:
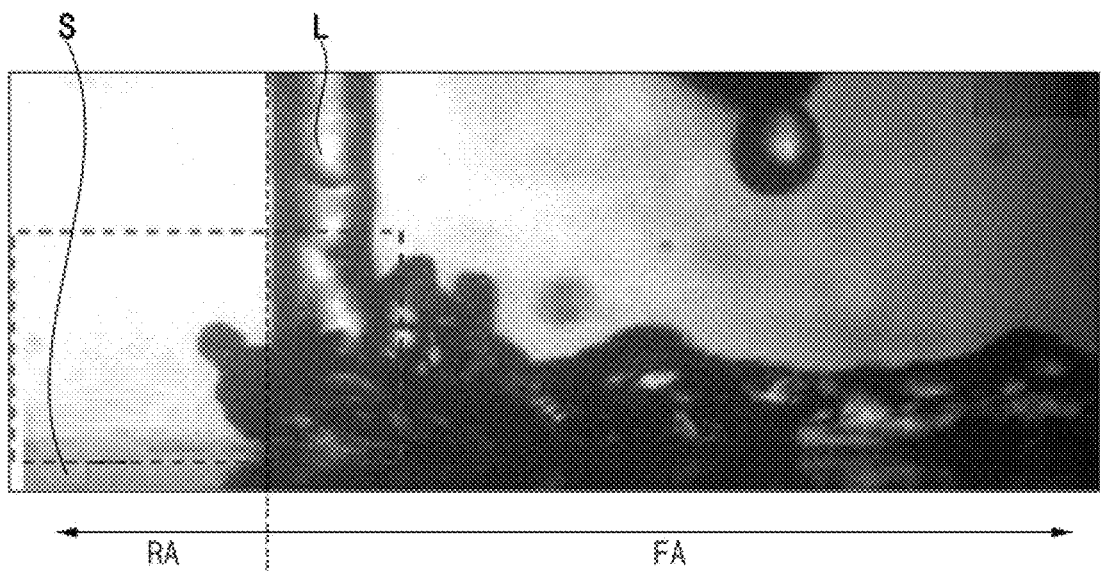

FIG. 10A is an enlarged view illustrating a backflow phenomenon occurring in a rear region of a chemical solution. FIG. 10B is an enlarged view illustrating a non-backflow phenomenon occurring in a rear region of a chemical solution. FIG. 10C is an enlarged view illustrating a splashing phenomenon occurring in a rear region of a chemical solution.

Referring to FIGS. 1A-1B and 10A-10C, when the nozzle 210 is the circular nozzle, as illustrated in FIG. 10A, the backflow phenomenon may occur in the rear region RA of the chemical solution L. In this case, the flow rate Q of the chemical solution L may be 350 Mlpm, the linear velocity Vw of the substrate stage 100 may be 7.3 m/s, and the predetermined angle θ of the nozzle 210 may be 90 degrees.

As illustrated in FIG. 10B, when the nozzle 210 is the circular nozzle, the non-backflow flow phenomenon may occur in the rear region RA of the chemical solution L. When the non-backflow phenomenon occurs in the chemical solution L, the chemical solution L may be stably applied on the semiconductor substrate S. In this case, the flow rate Q of the chemical solution L may be 350 Mlpm, the linear velocity Vw of the substrate stage 100 may be 7.3 m/s, and the predetermined angle θ of the nozzle 210 may be 30 degrees.

As illustrated in FIG. 10C, when the nozzle 210 is the circular nozzle, the splashing phenomenon may occur in the rear region RA of the chemical solution L. In this case, the flow rate Q of the chemical solution L may be 350 Mlpm, the linear velocity Vw of the substrate stage 100 may be 25.7 m/s, and the predetermined angle θ of the nozzle 210 may be 90 degrees.

Figure 11:
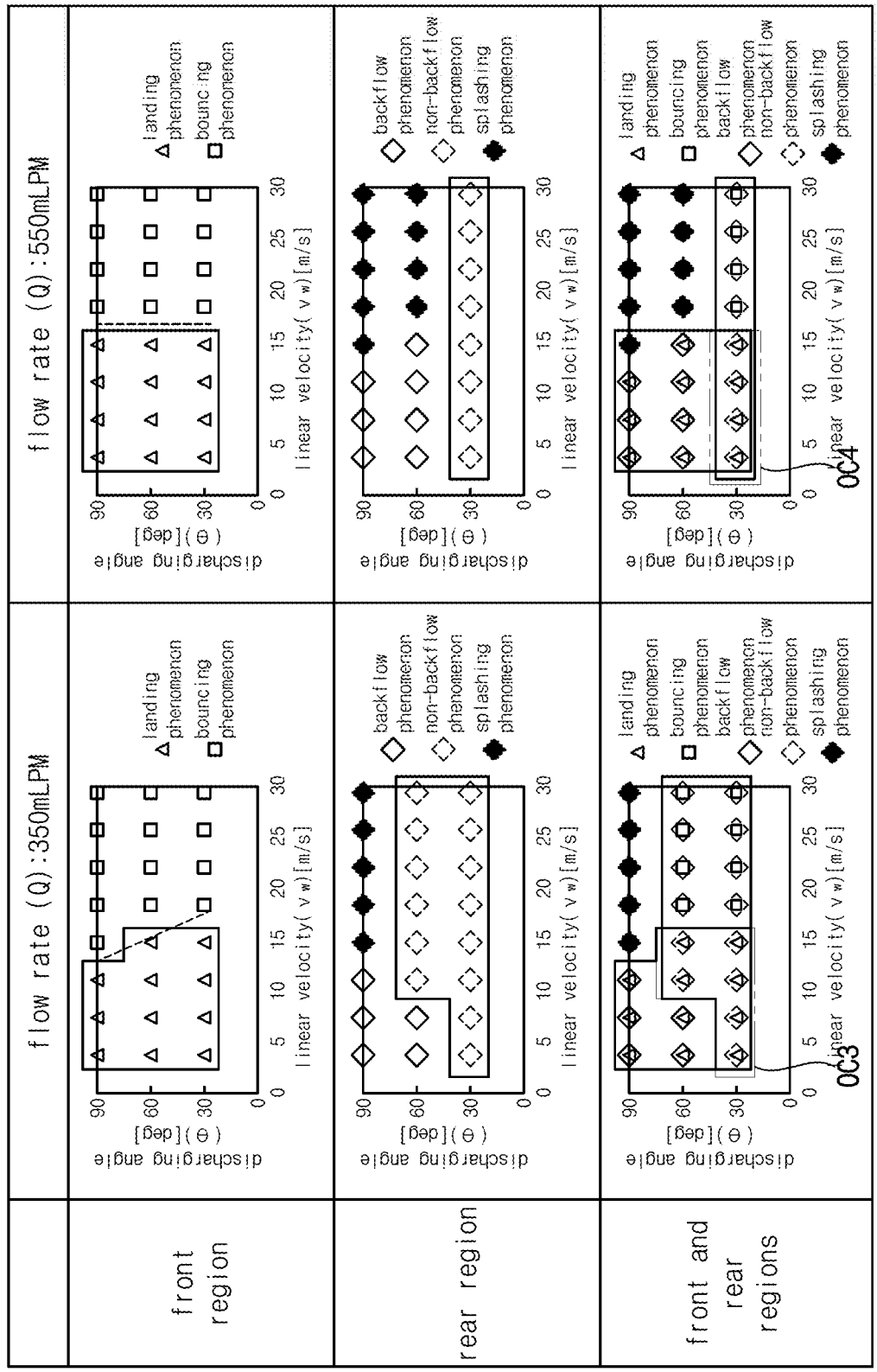
FIG. 11 is a view illustrating an optimized discharging angle and an optimized linear velocity according to a flow rate when a nozzle is a circular nozzle.

FIG. 11 is a view illustrating an optimized discharging angle and an optimized linear velocity according to a flow rate when a nozzle is a circular nozzle.

Referring to FIGS. 1A-1B and 9A to 11, when the flow rate Q of the chemical solution L is 350 Mlpm, the predetermined angle θ of the nozzle 210 may be optimized from 20 degrees to 70 degrees. When the flow rate Q of the chemical solution L is 550 Mlpm, the predetermined angular velocity ω of the substrate stage 100 may be optimized at 5 degrees to 20 degrees. In a third optimization condition OC3, the chemical solution L may minimize the bouncing phenomenon, the backflow phenomenon, and the splashing phenomenon.

When the flow rate Q of the chemical solution L is 550 Mlpm, the predetermined angle θ of the nozzle 210 may be optimized at 20 degrees to 40 degrees. When the flow rate Q of the chemical solution L is 550 Mlpm, the predetermined angular velocity ω of the substrate stage 100 may be optimized at 5 degrees to 20 degrees. In a fourth optimization condition OC4, the chemical solution L may minimize the bouncing phenomenon, the backflow phenomenon, and the splashing phenomenon.

In the third optimization condition OC3 and the fourth optimization condition OC4, the chemical solution L may be stably applied onto the semiconductor substrate S. When the nozzle 210 is the circular nozzle, the predetermined angle θ of the nozzle 210 according to the third optimization condition OC3 and the fourth optimization condition OC4 may increase as the flow rate Q of the chemical solution L decreases Thus, the nozzle 210 discharging the chemical solution L may move from the central region CR to the peripheral region PR of the semiconductor substrate S. Since the substrate stage 100 rotates at the predetermined angular velocity ω to apply the chemical solution L onto the semiconductor substrate S, the linear velocity of the substrate stage 100 may vary according to the position of the nozzle. The substrate processing apparatus 10 may control the predetermined angle θ of the nozzle 210, the predetermined angular velocity ω of the substrate stage 100, and the predetermined speed Vn of the nozzle 210 according to the position of the nozzle. The substrate processing apparatus 10 may control the predetermined angle θ of the nozzle 210, the predetermined angular velocity ω of the substrate stage 100, and the predetermined speed Vn of the nozzle 210 to prevent the backflow phenomenon or the splashing phenomenon of the chemical solution L that are caused by the linear velocity of the substrate stage 100.

Also, the substrate processing apparatus 10 may continuously change the predetermined angle θ of the nozzle 210. Since the substrate processing apparatus 10 continuously changes the predetermined angle θ of the nozzle 210, the substrate processing apparatus 10 may create an optimal environment capable of preventing the backflow phenomenon or the splashing phenomenon of the chemical solution L according to the position of the nozzle.

Hereinafter, a method of manufacturing a semiconductor device using the substrate processing apparatus in FIG. 1A will be described.

Figure 12:
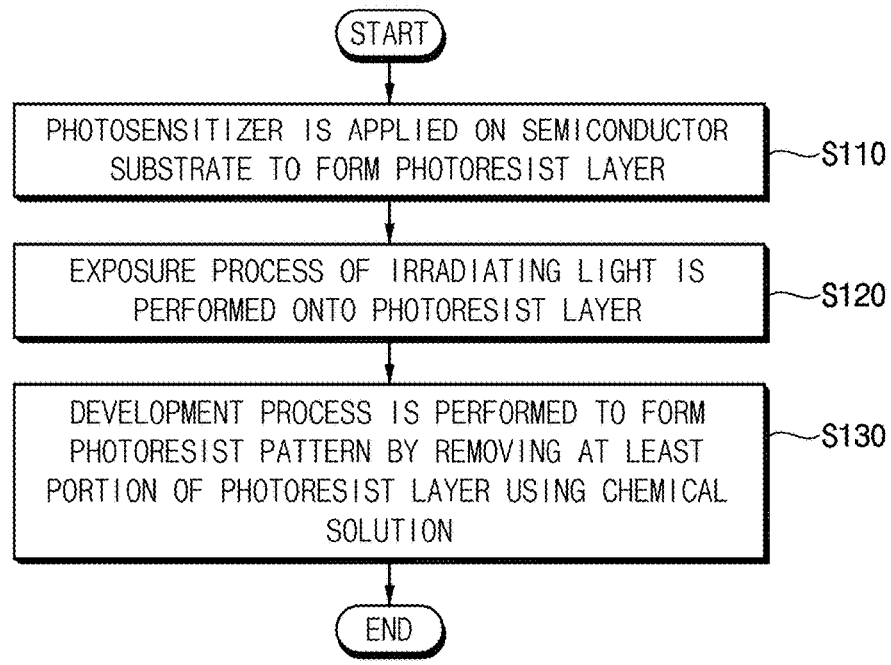
FIG. 12 is a flowchart illustrating a method of manufacturing a semiconductor device in accordance with example embodiments.

FIG. 12 is a flowchart illustrating a method of manufacturing a semiconductor device in accordance with example embodiments.

Referring to FIGS. 1A to 12, first, a photosensitizer may be applied on the semiconductor substrate S to form a photoresist layer (S110).

In example embodiments, a method of manufacturing a semiconductor device may include a lithography process capable of forming a circuit using light on the semiconductor substrate S.

The photosensitizer may include a positive photosensitive insulating material or a negative photosensitive insulating material. A molecular structure of the positive photosensitive insulating material may be destroyed in response to the light. A molecular structure of the negative photosensitive insulating material may be more strongly bonded in response to the light.

Then, an exposure process of irradiating the light may be performed on the photoresist layer (S120).

In example embodiments, a mask may be disposed on the photoresist layer formed on the semiconductor substrate S in the exposure process, and the light may be irradiated onto the mask. For example, the light may include extreme ultraviolet (EUV).

The mask may have patterns. At least some of the light may pass through the patterns and may be irradiated onto the photoresist layer, and at least some of the other light may be blocked by the mask. A portion of the photoresist layer irradiated by the light may react to the light such that the molecular structure may be more strongly bonded or the molecular structure may be destroyed.

Then, a development process may be performed to form a photoresist pattern by removing at least a portion of the photoresist layer using the chemical solution L (S130).

In example embodiments, the development process may selectively remove at least the portion of the photoresist layer formed on the semiconductor substrate S through a development solution. The development solution may be uniformly applied onto the semiconductor substrate S through the substrate processing apparatus 10.

Figure 13:
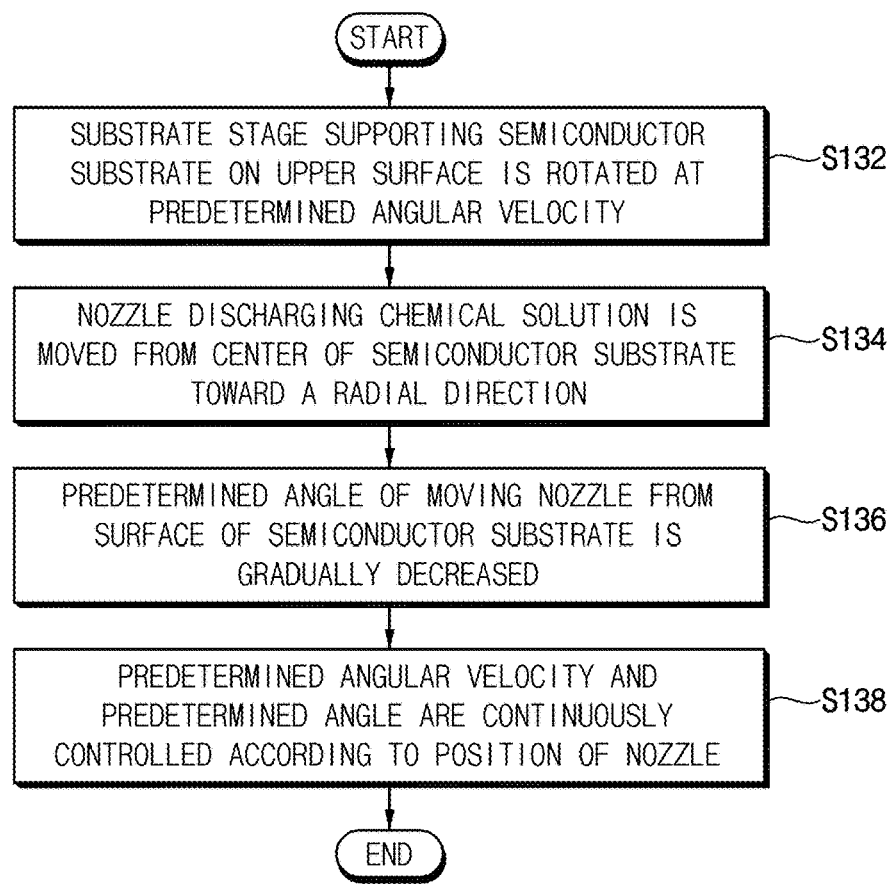
FIG. 13 is a flowchart illustrating the development process in FIG. 12.

Hereinafter, the development process in FIG. 12 will be described in more detail with reference to FIG. 13. FIG. 13 is a flowchart illustrating the development process in FIG. 12.

Referring to FIGS. 1A and 13, first, the substrate stage 100 supporting the semiconductor substrate S on an upper surface thereof may be rotated at a predetermined angular velocity ω (S132), and the nozzle 210 discharging the chemical solution L onto the semiconductor substrate S may be moved from the center CP of the semiconductor substrate S in a radial direction (X direction) (S134).

In example embodiments, the substrate stage 100 supporting the semiconductor substrate S may be rotated at the predetermined angular velocity ω. Since the substrate stage 100 rotates at the predetermined angular velocity ω, the semiconductor substrate S may rotate at the predetermined angular velocity ω. Since the semiconductor substrate S rotates at the predetermined angular velocity ω the nozzle 210 may evenly apply the chemical solution L on the semiconductor substrate S.

The chemical solution L may be discharged onto the semiconductor substrate S through the nozzle 210 of the discharge device 200. The nozzle arm 230 on which the nozzle 210 is fixed may discharge the chemical solution L and may move in the radial direction (X direction) at a predetermined speed Vn. Since the nozzle 210 discharges the chemical liquid L and is moved by the nozzle arm 230, the chemical solution L may be evenly applied on the semiconductor substrate S. For example, the nozzle 210 may sequentially move from the center CP of the semiconductor substrate S to the first landing point P1, the second landing point P2, and the third landing point P3.

The nozzle 210 may move in a uniformly accelerated motion in the central region CR of the semiconductor substrate S. The nozzle 210 may move in a uniform motion (e.g., in a uniform speed u) in a peripheral region PR surrounding the central region CR. Since the semiconductor substrate S rotates at the predetermined angular velocity ω and the discharge device 200 moves at the predetermined speed Vn, the chemical solution L may be evenly applied on the semiconductor substrate S.

Then, the predetermined angle θ of the moving nozzle 210 from a surface of the semiconductor substrate S may be gradually decreased (S136).

In example embodiments, the predetermined angle θ may vary according to a position of the nozzle 210. Since a linear velocity of the semiconductor substrate S increases as the nozzle 210 moves from the central region CR to the peripheral region PR, the predetermined angle θ of the nozzle 210 may decrease. The predetermined angle θ of the nozzle 210 may be inclined toward a linear velocity direction of the semiconductor substrate S.

As the nozzle 210 moves from the central region CR to the peripheral region PR, the predetermined angle θ of the nozzle 210 may gradually decrease. Since the predetermined angle θ of the nozzle 210 decreases, a difference between a landing speed of the chemical solution L and the linear velocity of the semiconductor substrate S according to the position of the nozzle 210 may decrease. Since the predetermined angle θ of the nozzle 210 decreases, a backflow phenomenon or a splashing phenomenon occurring in the chemical solution L may be reduced. For example, the predetermined angle θ may be within a range of 30 degrees to 90 degrees.

Then, the predetermined angular velocity ω and the predetermined angle θ may be continuously controlled according to the position of the nozzle 210 such that the backflow phenomenon or the splashing phenomenon of the chemical solution L does not occur (S138).

In example embodiments, the predetermined angular velocity ω and the predetermined angle θ may be controlled such that the landing speed of the chemical solution L is maintained constant. The predetermined angular velocity ω and the predetermined angle θ may be simultaneously controlled such that the chemical solution L is uniformly applied on the semiconductor substrate S.

By way of summation and review, a linear velocity of a rotating substrate stage may be different depending on a position of a nozzle above the substrate stage that discharges a chemical solution. Since the linear velocity of the substrate stage is different, a backflow phenomenon or a splashing phenomenon may occur when the chemical solution is discharged on the semiconductor substrate. The backflow phenomenon or the splashing phenomenon in the chemical solution may cause a defect in the semiconductor substrate.

In contrast, example embodiments provide a substrate processing apparatus capable of preventing a backflow phenomenon or a splashing phenomenon of a chemical solution that is discharged onto a semiconductor substrate. Example embodiments also provide a method of manufacturing a semiconductor device using the substrate processing apparatus.

That is, according to example embodiments, a substrate processing apparatus may include a substrate stage configured to support a semiconductor substrate and rotatable at a predetermined angular velocity, and a discharge device configured to discharge a chemical solution onto the semiconductor substrate. The discharge device includes a nozzle arm movable along a radial direction from a central region of the semiconductor substrate disposed on the substrate stage to a peripheral region surrounding the central region, a nozzle provided on the nozzle arm toward the semiconductor substrate, the nozzle configured to discharge the chemical solution onto the semiconductor substrate at a predetermined angle from a surface of the semiconductor substrate, and an angle changer configured to change the predetermined angle such that the predetermined angle gradually decreases as the nozzle arm moves from the central region to the peripheral region.

Thus, the nozzle arm fixing the nozzle discharging the chemical solution may move from the central region to the peripheral region of the semiconductor substrate. Since the substrate stage rotates at the predetermined angular velocity to apply the chemical solution onto the semiconductor substrate, a linear velocity of the substrate stage may vary according to a position of the nozzle. The substrate processing apparatus may control the predetermined angle of the nozzle, the predetermined angular velocity of the substrate stage, and a predetermined speed of the nozzle according to the position of the nozzle. The substrate processing apparatus may control the predetermined angle of the nozzle, the predetermined angular velocity of the substrate stage, and the predetermined speed of the nozzle to prevent a backflow phenomenon or a splashing phenomenon of the chemical solution that are caused by the linear velocity of the substrate stage.

Also, the substrate processing apparatus may continuously change the predetermined angle of the nozzle. Since the substrate processing apparatus continuously changes the predetermined angle of the nozzle, the substrate processing apparatus may create an optimal environment capable of preventing the backflow phenomenon or the splashing phenomenon of the chemical solution according to the position of the nozzle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:
   a substrate stage configured to support a semiconductor substrate, the substrate stage being rotatable at a predetermined angular velocity; and
   a discharge device above the substrate stage, the discharge device being configured to discharge a chemical solution onto the semiconductor substrate, and the discharge device including:
   a nozzle arm movable along a radial direction from a central region of the substrate stage to a peripheral region surrounding the central region,
   a nozzle on the nozzle arm, the nozzle facing the substrate stage, and the nozzle being configured to discharge the chemical solution onto the semiconductor substrate at a predetermined angle relative to a surface of the semiconductor substrate, and
   an angle changer configured to change the predetermined angle such that the predetermined angle gradually decreases as the nozzle arm moves from the central region to the peripheral region.

2. The substrate processing apparatus as claimed in claim 1, wherein the predetermined angle is within a range of 30 degrees to 90 degrees.

3. The substrate processing apparatus as claimed in claim 1, wherein the angle changer is configured to change the predetermined angle in real time in correspondence to the predetermined angular velocity of the substrate stage.

4. The substrate processing apparatus as claimed in claim 1, wherein the nozzle is configured to discharge the chemical solution in a linear velocity direction in which the semiconductor substrate rotates.

5. The substrate processing apparatus as claimed in claim 1, wherein the nozzle includes a slit nozzle or a circular nozzle.

6. The substrate processing apparatus as claimed in claim 5, wherein the predetermined angular velocity of the substrate stage decreases as a flow rate of the chemical solution increases when the nozzle includes the slit nozzle.

7. The substrate processing apparatus as claimed in claim 5, wherein the predetermined angle of the nozzle increases as a flow rate of the chemical solution decreases when the nozzle includes the circular nozzle.

8. The substrate processing apparatus as claimed in claim 1, wherein the nozzle arm is configured to move at a predetermined speed along the radial direction, the predetermined speed gradually decreasing as the nozzle arm moves from the central region to the peripheral region.

9. The substrate processing apparatus as claimed in claim 1, wherein the predetermined angular velocity of the substrate stage decreases exponentially in the peripheral region.

10. The substrate processing apparatus as claimed in claim 1, wherein the predetermined angular velocity in the peripheral region is defined by following Equation 1:

$$\omega = \frac{k}{u\left(t - \frac{\tau}{2}\right)} \ (\tau \le t), \quad \text{[Equation 1]}$$

and

ω is the predetermined angular velocity, k is a constant, t is time, τ is a predetermined time period for the nozzle to enter the peripheral region, and u is a predetermined speed of the discharge device.

11. A substrate processing apparatus, comprising:
a substrate stage in a chamber for performing a development process on a photoresist layer on a semiconductor substrate, the substrate stage being configured to support the semiconductor substrate and being rotatable at a predetermined angular velocity;
a discharge device configured to discharge a chemical solution onto the photoresist layer, and the discharge device including:
a nozzle over the semiconductor substrate movable from a center of the semiconductor substrate in a radial direction, wherein the nozzle is configured to discharge the chemical solution onto the semiconductor substrate at a predetermined angle relative to a surface of the semiconductor substrate; and
an angle changer configured to change the predetermined angle such that the predetermined angle gradually decreases as the nozzle moves from the center of the semiconductor substrate to a peripheral region; and
a control device configured to change the predetermined angular velocity and the predetermined angle according to a position of the nozzle.

12. The substrate processing apparatus as claimed in claim 11, wherein the control device decreases the predetermined angle within a range of 30 degrees to 90 degrees.

13. The substrate processing apparatus as claimed in claim 11, wherein the nozzle discharges the chemical solution in a linear velocity direction in which the semiconductor substrate rotates.

14. The substrate processing apparatus as claimed in claim 11, wherein the control device controls the predetermined angular velocity and the predetermined angle such that a landing speed of the chemical solution is constantly maintained.

15. The substrate processing apparatus as claimed in claim 11, wherein:
the nozzle includes a slit nozzle, and
the control device decreases the predetermined angular velocity as a flow rate of the chemical solution increases.

16. The substrate processing apparatus as claimed in claim 11, wherein:
the nozzle includes a circular nozzle, and
the control device increases the predetermined angle as a flow rate of the chemical solution decreases.

17. The substrate processing apparatus as claimed in claim 11, wherein the nozzle moves with a constant acceleration motion where a speed increases by a same amount each second in a central region of the semiconductor substrate, and
the nozzle moves with a uniform motion in a peripheral region surrounding the central region.

18. The substrate processing apparatus as claimed in claim 17, wherein the control device exponentially decreases the predetermined angular velocity when the nozzle moves with the uniform motion.

19. The substrate processing apparatus as claimed in claim 11, wherein the nozzle moves at a predetermined speed, and the control device controls the predetermined speed according to the predetermined angular velocity.

20. A substrate processing apparatus, comprising:
a substrate stage in a chamber for performing a development process on a semiconductor substrate, the substrate stage being configured to support the semiconductor substrate and being rotatable at a predetermined angular velocity;
a discharge device including a nozzle arm, a nozzle, and an angle changer, the nozzle arm being movable along a radial direction from a central region of the semiconductor substrate disposed on the substrate stage to a peripheral region surrounding the central region, the nozzle being on the nozzle arm and being configured to discharge a chemical solution onto the semiconductor substrate in a linear velocity direction in which the semiconductor substrate rotates, at a predetermined angle relative to a surface of the semiconductor substrate, and the angle changer being configured to change the predetermined angle such that the predetermined angle gradually decreases as the nozzle arm moves from the central region to the peripheral region; and
a control device configured to control the predetermined angular velocity and the predetermined angle according to a position of the nozzle.

* * * * *